(12) United States Patent
Schmit et al.

(10) Patent No.: US 9,831,035 B2
(45) Date of Patent: Nov. 28, 2017

(54) CAPACITOR WITH IMPROVED HEAT DISSIPATION

(71) Applicant: Deere & Company, Moline, IL (US)

(72) Inventors: Christopher J. Schmit, Fargo, ND (US); Neal D. Clements, Sheldon, ND (US); Andrew D. Wieland, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 223 days.

(21) Appl. No.: 14/529,337

(22) Filed: Oct. 31, 2014

(65) Prior Publication Data

US 2016/0126011 A1   May 5, 2016

(51) Int. Cl.
| | |
|---|---|
| H01G 2/08 | (2006.01) |
| H01G 4/32 | (2006.01) |
| H01G 4/38 | (2006.01) |
| H01G 4/228 | (2006.01) |
| H05K 1/18 | (2006.01) |
| H05K 1/02 | (2006.01) |
| H05K 3/34 | (2006.01) |

(52) U.S. Cl.
CPC ............... *H01G 2/08* (2013.01); *H01G 4/228* (2013.01); *H01G 4/32* (2013.01); *H01G 4/38* (2013.01); *H05K 1/0203* (2013.01); *H05K 1/181* (2013.01); *H05K 3/3426* (2013.01); *H05K 2201/10015* (2013.01); *H05K 2201/1056* (2013.01); *H05K 2201/10522* (2013.01); *H05K 2201/10545* (2013.01); *H05K 2201/10651* (2013.01)

(58) Field of Classification Search
CPC ............ H01G 2/08; H01G 4/228; H01G 4/32; H01G 4/38
See application file for complete search history.

(56) References Cited

U.S. PATENT DOCUMENTS

| | | | | | |
|---|---|---|---|---|---|
| 2,249,493 | A | * | 7/1941 | Pistor | H01G 4/228 |
| | | | | | 361/275.1 |
| 2,270,953 | A | * | 1/1942 | Manz | H01G 4/228 |
| | | | | | 333/182 |
| 3,097,330 | A | * | 7/1963 | Fischer | H01G 4/228 |
| | | | | | 361/275.1 |

(Continued)

FOREIGN PATENT DOCUMENTS

| GB | 2159329 A | 11/1985 |
|---|---|---|
| JP | 05055082 A | * 3/1993 |

OTHER PUBLICATIONS

Search Report issued in counterpart application No. GB1518818.8, dated May 6, 2016 (3 pages).

*Primary Examiner* — David M Sinclair

(57) ABSTRACT

A capacitor comprises a first winding member, where the first winding member comprises a first dielectric layer and a first conductive layer. A second winding member comprises a second dielectric layer and second conductive layer. The first winding member is interleaved, partially or entirely, with the second winding layer. A dielectric package is adapted to at least radially contain or border the first winding member and the second winding member. A first metallic member has a generally planar, radially extending surface for electrically and mechanically contacting an upper portion the first conductive layer. A second metallic member has a generally planar, radially extending surface for electrically and mechanically contacting a lower portion of the second conductive layer.

15 Claims, 7 Drawing Sheets

(56) References Cited

U.S. PATENT DOCUMENTS

| | | | | |
|---|---|---|---|---|
| 3,239,720 A | * | 3/1966 | Rayburn | H01G 2/06 24/DIG. 51 |
| 3,849,708 A | | 11/1974 | Leighton | |
| 4,547,832 A | * | 10/1985 | Lavene | H01G 4/228 29/25.42 |
| 4,578,737 A | * | 3/1986 | Westermann | H01G 2/06 29/25.42 |
| 4,672,506 A | * | 6/1987 | Deguchi | H01G 4/30 361/323 |
| 4,914,547 A | * | 4/1990 | Toro | H01G 2/065 29/25.42 |
| 4,933,811 A | * | 6/1990 | Dorlanne | H01C 17/006 361/540 |
| 5,053,916 A | | 10/1991 | Weekamp et al. | |
| 5,375,035 A | | 12/1994 | Stoddard | |
| 5,608,600 A | * | 3/1997 | Lavene | H01G 4/012 29/25.42 |
| 5,784,248 A | | 7/1998 | Tomiyasu et al. | |
| 7,786,555 B2 | * | 8/2010 | Xiaochun | H01L 23/3107 257/666 |
| 2002/0172023 A1 | * | 11/2002 | Blakely | H05K 1/0231 361/763 |
| 2006/0018098 A1 | * | 1/2006 | Hill | H05K 1/0204 361/708 |
| 2006/0034036 A1 | | 2/2006 | Miura et al. | |
| 2007/0030624 A1 | * | 2/2007 | Hosking | H01G 4/232 361/301.5 |
| 2007/0217124 A1 | * | 9/2007 | Lavene | H01G 2/18 361/518 |
| 2010/0014217 A1 | | 1/2010 | Kawahara et al. | |
| 2010/0039748 A1 | * | 2/2010 | Fujii | H01G 2/08 361/274.1 |
| 2013/0182372 A1 | * | 7/2013 | Shepard | H01G 2/08 361/307 |
| 2014/0166351 A1 | | 6/2014 | Lee et al. | |
| 2014/0196937 A1 | | 7/2014 | Park et al. | |

* cited by examiner

# CAPACITOR WITH IMPROVED HEAT DISSIPATION

FIELD OF THE INVENTION

This disclosure relates to a capacitor with improved heat dissipation or an electronic assembly with one or more capacitors with improved heat dissipation.

BACKGROUND

In certain prior art, a capacitor or an electronic assembly that incorporates one or more capacitors may have inadequate heat dissipation that reduces the longevity or maximum power output of an electronic circuit. For certain film capacitors, the heat dissipation is limited by the package design of the capacitor. Accordingly, there is need for a capacitor or electronic assembly with improved heat dissipation.

SUMMARY

In one embodiment, a capacitor comprises a first winding member, where the first winding member comprises a first dielectric layer and a first conductive layer. The first conductive layer overlies at least a portion of the first dielectric layer. A second winding member comprises a second dielectric layer and second conductive layer. The second conductive layer overlies at least a portion of the second dielectric layer. The first winding member is interleaved, partially or entirely, with the second winding layer. A dielectric package or shell is adapted to at least radially contain or border the first winding member and the second winding member. A first metallic member has a generally planar, radially extending surface for electrically and mechanically contacting an upper portion the first conductive layer. A second metallic member has a generally planar, radially extending surface for electrically and mechanically contacting a lower portion of the second conductive layer. A first lead is coupled to the first metallic layer and extends through an upper side surface. In one embodiment, an optional second lead extends through the upper side surface, where the second lead is spaced apart from the first lead. However, in other embodiments the second lead is not required because the second metallic member can be exposed to serve as an auxiliary lead.

DETAILED DESCRIPTION

A package of the capacitor 10 comprises one or more leads (e.g., 22, 24), terminals, or electrodes and an enclosure, shell or skin. The package may be configured for optimal or improved heat dissipation of thermal energy from the capacitor 10 to the ambient environment, a circuit board 28 upon which the capacitor 10 is mounted, or an enclosure (800 in FIG. 8) or housing in which the capacitor 10 is housed, for example. The capacitor 10 may be made or constructed as a film capacitor, or otherwise.

Figure 1:
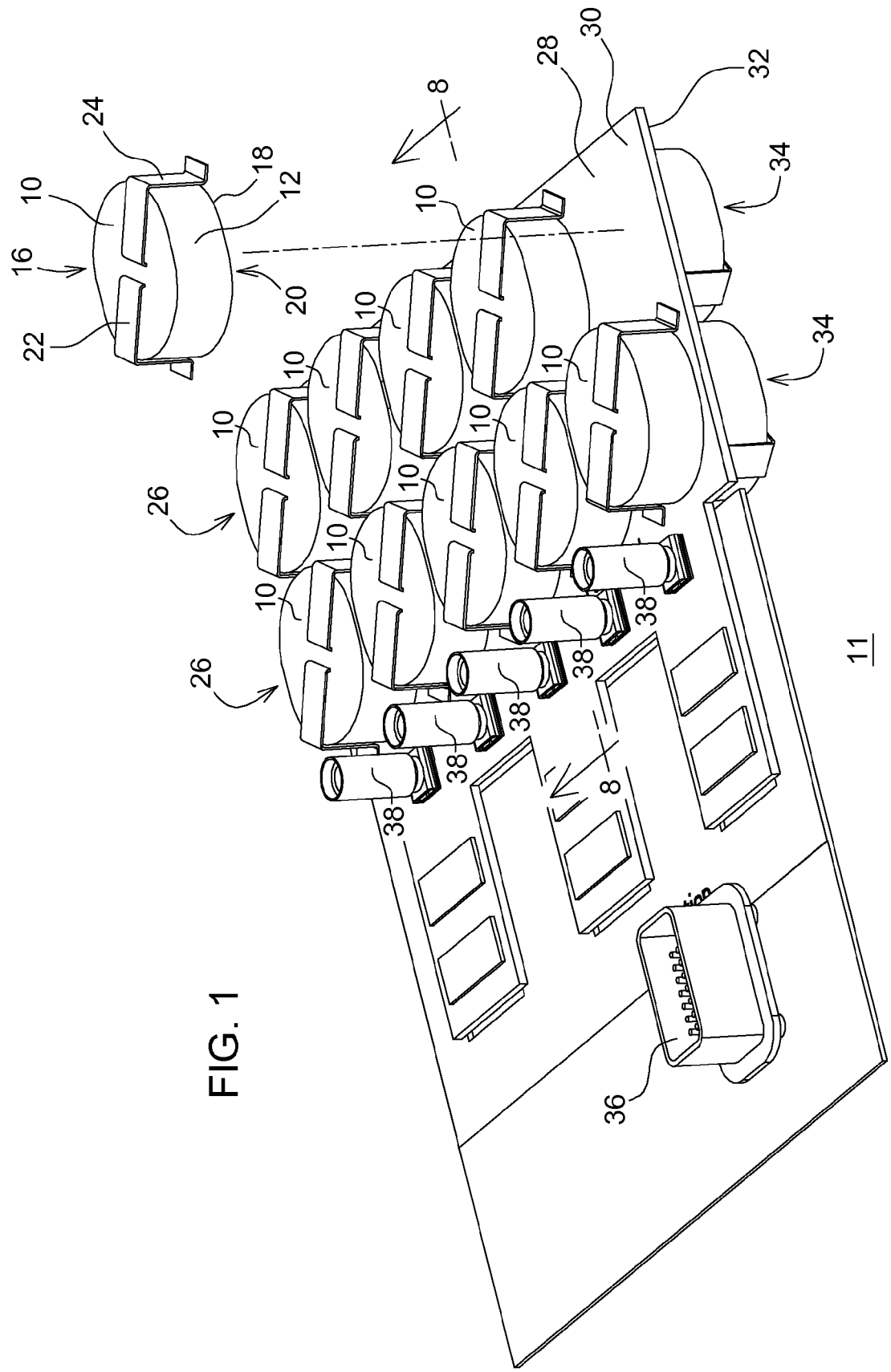
FIG. 1 is a perspective view of one embodiment of an electronic assembly with capacitors arranged in rows and one capacitor shown in an exploded format separate from the electronic assembly (without any enclosure).

FIG. 1 illustrates one embodiment of an electronic assembly 11 that comprises a circuit board 28 having one or more conductive traces and one or more capacitors 10 mounted on the circuit board 28. The circuit board has a first side 30 and a second side 32 opposite the first side 30. As shown, the capacitors 10 are arranged in one or more rows (26, 34) on both sides (30, 32) of the circuit board 28, but the capacitors 10 may be arranged in other configurations on one or both sides (30, 32) of the circuit board 28. The circuit board 28 may have one or more connectors, such as one or more metal connectors 38 or a multi-conductor connector 36.

Capacitors 10 may be soldered to a circuit board 28, such as a printed circuit board 28. In one configuration, the circuit board 28 is optionally constructed with heavy traces (e.g., equal to or greater than 8 ounce traces or having a thickness greater than the ordinary metallic traces on the circuit board 28) to conduct sufficient amounts of electrical current for certain power electronic circuits. Mounting the capacitors 10 to the circuit board 28 in this fashion allows for heat to be transferred or communicated from the bottom 20 of the capacitor 10, through the circuit board 28, to any heat sink or heat-sinking enclosure associated with the circuit board 28.

Figure 2:
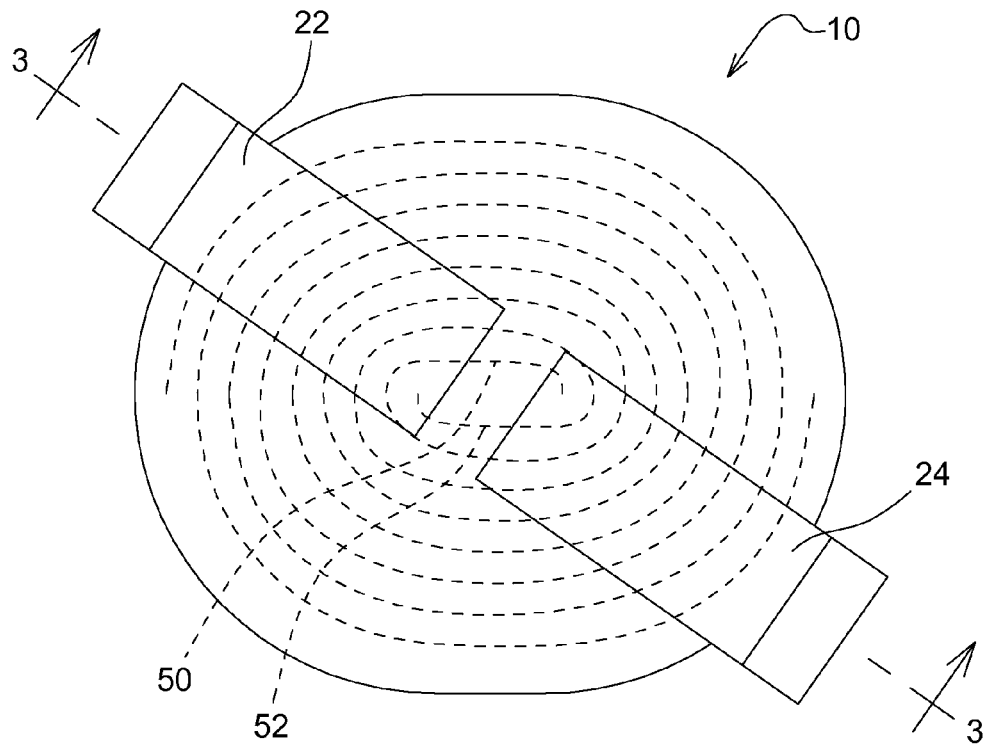
FIG. 2 is a plan or top view of single capacitor of FIG. 1 that illustrates interior windings as dashed lines.
Figure 3:
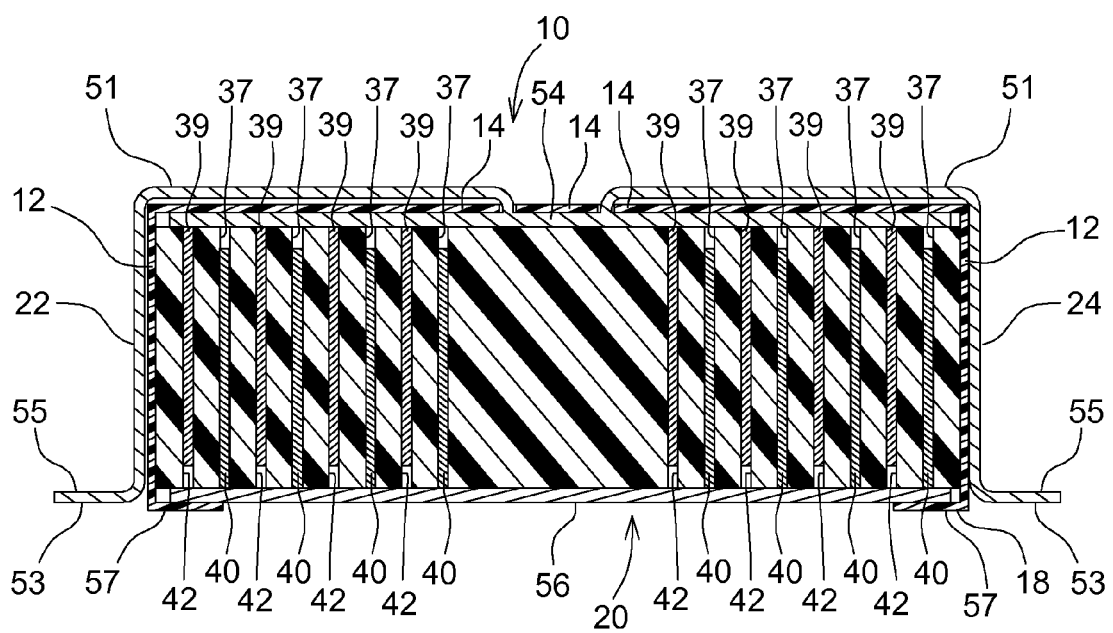
FIG. 3 shows a cross-section of the capacitor of FIG. 2 along reference line 3-3 of FIG. 2.

As illustrated in FIG. 2 and FIG. 3, in one embodiment a capacitor 10 comprises a first winding member 50 and a second winding member 52. The first winding member 50 is interleaved, partially or entirely, with the second winding layer. In one embodiment, the first winding member 50 comprises a first dielectric layer 42 and a first conductive layer 39. The first conductive layer 39 overlies at least a portion of the first dielectric layer 42. A second winding member 52 comprises a second dielectric layer 37 and second conductive layer 40. The second conductive layer 40 overlies at least a portion of the second dielectric layer 42.

A dielectric package 12 is adapted to at least radially contain or border the first winding member 50 and the second winding member 52. A dielectric package 12 contains radially or borders radially the first winding member 50 and the second winding member 52. The dielectric package 12 may comprise a dielectric skin or dielectric shell, for example.

A first metallic member 54 has a generally planar, radially extending surface for electrically and mechanically contacting an upper portion the first conductive layer 39. A second metallic member 56 has a generally planar, radially extending surface for electrically and mechanically contacting a lower portion of the second conductive layer 40. A first lead 22 is coupled to the first metallic member 54 and extends through an upper side surface 14.

In one configuration, the first dielectric layer 42 and the second dielectric layer 37 are formed of polyethylene, a plastic, or polymer that is substantially elastically deformable or generally pliable. The first conductive layer 39 and the second conductive layer 40 can be a metal foil layer or a metallized layer that is formed by electro-less deposition, sputtering, plating or other process. The first winding member 50 has a side margin of the first dielectric layer 42 that is not metallized or covered by a first conductive layer 39; the second winding member 52 has a side margin that is not metallized or covered by a second conductive layer 40, where the first winding member 50 and the second winding member 52 are stacked on top 16 of each other and wound around dielectric bobbin or form (e.g., a removable or captive form).

FIG. 2 and FIG. 3 show a capacitor 10 in accordance with the disclosure. The capacitor 10 has leads coming out the top 16 of the capacitor 10 as well as a metallic pad placed on the bottom 20 of the film capacitor 10. The bottom 20 of the capacitor 10 has the second metallic member 56 or metallic pad connected to the second winding member 52 (or the second conductive layer 40) for improved thermal dissipation. Similarly, the connection leads are formed in a substantially planar configuration near or at the top 16 of the capacitor 10 for improved heat dissipation. This capacitor 10 has been designed for optimal heat transfer from the body of the capacitor 10 via thermally efficient axial heat flow via the first metallic member 54, the second metallic member 56, and associated leads. The second metallic member 56 or exposed metallic pad on the bottom 20 of the cap can be soldered or placed in contact (e.g., directly or indirectly with thermally conductive material or grease) with a surface, receiving pad, or conductive trace that can transfer heat (e.g., to a heat sink or enclosure 800). The top 16 of the capacitor 10 has also been designed as to allow the flat configured leads (22, 24) to press up against a heat sink or enclosure 800 and remove heat generated in or by the capacitor 10. The leads (22, 24) are then configured to allow the electrical connection and mechanical connection to be made to the circuit board 28. In an alternate embodiment, the capacitor 10 can also be made to work without the bottom 20 having a metallic interface or exposed metallic pad for direct or indirect contact with a receiving pad, heat sink or traces on the circuit board 28.

Figure 4:
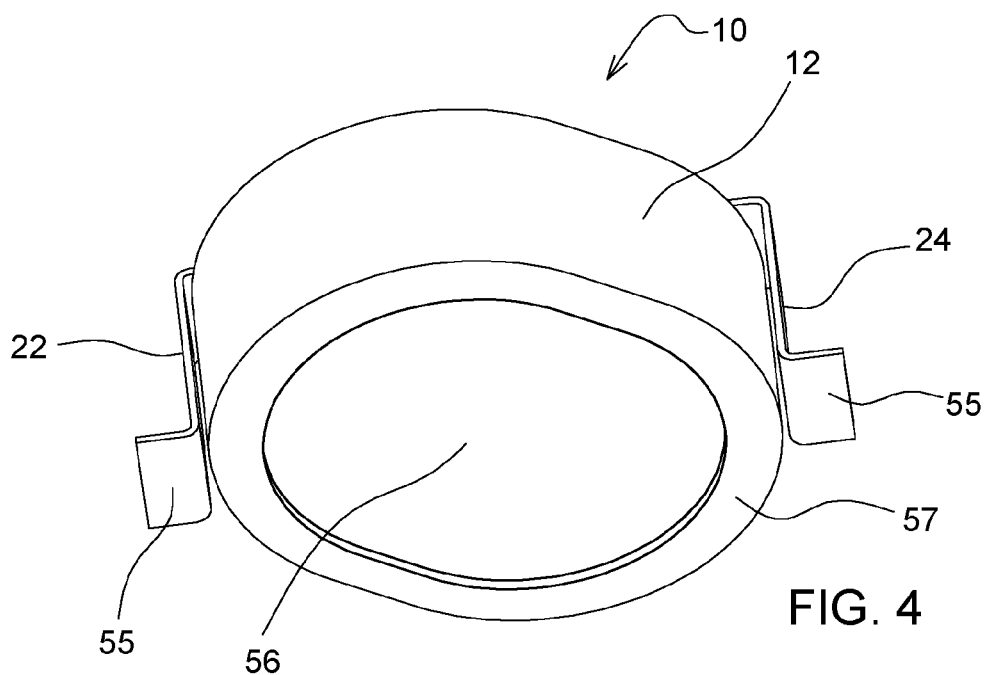
FIG. 4 shows a perspective view of a bottom of a capacitor of FIG. 2.

As best illustrated in FIG. 3 and FIG. 4, the dielectric package 12 has or is associated with an upper side surface 14 and a lower side surface 18 opposite the upper side surface 14. A first metallic member 54 has a generally planar, radially extending surface (e.g., first annular surface) for electrically and mechanically contacting an upper portion of the first conductive layer 39. A second metallic member 56 has a generally planar, radially extending surface (e.g., second annular surface) for electrically and mechanically contacting a lower portion of the second conductive layer 40. A first lead 22 is coupled to the first conductive layer 39, via first metallic member 54, and extends through the upper side surface 14. A second lead 24 extends through the upper side surface 14. The second lead 24 is spaced apart from the first lead 22. In one embodiment, the second lead 24 is coupled to an upper portion of the first conductive layer 39 via the first metallic member 54.

The dielectric package 12 has a lower side surface 18 opposite the upper side surface 14. The first lead 22 has generally planar upper surfaces 51 substantially parallel to or co-planar to the upper side surface 14 and generally planer lower surfaces 53 parallel or co-planar to the lower side surface 18. The second lead 24 has generally planar upper surfaces 51 substantially parallel to or co-planar to the upper side surface 14 and generally planar lower surfaces 53 substantially parallel or co-planar to the lower side surface 18. In one embodiment, the first lead 22 and the second lead 24 each terminate in a metallic pad 55 for mounting a mating pad or conductive trace on a circuit board. The dielectric package 12 has a lower side surface 18 opposite the upper side surface 14; the lower side surface 18 comprises the second metallic member 56 with an exposed exterior surface or a metallic pad. FIG. 4 illustrates an exposed metallic pad associated with the second metallic member 56. The metallic pad can be soldered to a corresponding mounting pad or conductive trace on the circuit board 28. In one embodiment, the second metallic member 56 has its perimeter covered or bonded to a dielectric perimeter member 57 or wall.

FIG. 2 and FIG. 3 illustrates how the space-saving leads (24, 26) are bent as to occupy the so-called corners of the capacitor 10. In a standard design (not shown), a film capacitor would be placed in a rectangular plastic container or box that is filled with epoxy to secure the windings. In the configuration, the rectangular box of the capacitor 10 has been replaced with a generally elliptical configuration (e.g., elliptical, cylindrical, or oblong shaped container) as to make use of the corner space and to minimize the overall mounting footprint of the capacitor 10. The footprint is reduced because if the capacitor 10 where housed in a square box the lead would have to extend outside of this footprint. FIG. 1 illustrates how rows (26, 34) of capacitors 10 are nested together, in close proximity, to construct a capacitor bank, with the space-saving lead configuration (22, 24).

Figure 5:
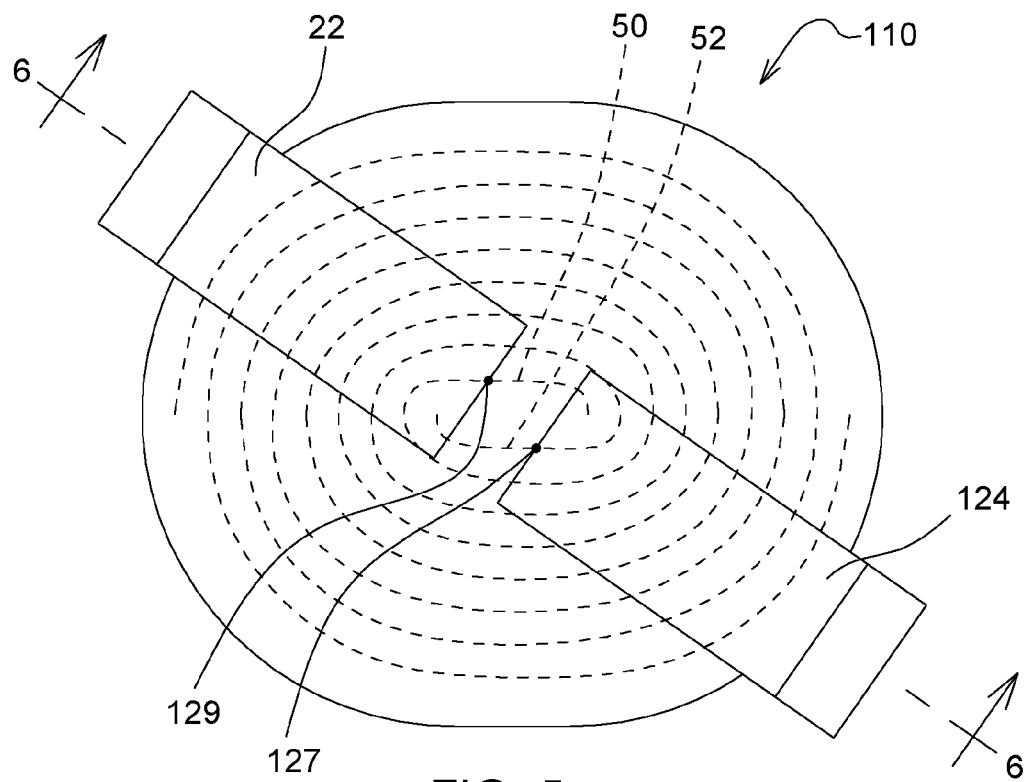
FIG. 5 illustrates a plan or top view of another embodiment of a capacitor that illustrates the interior windings in phantom.
Figure 6:
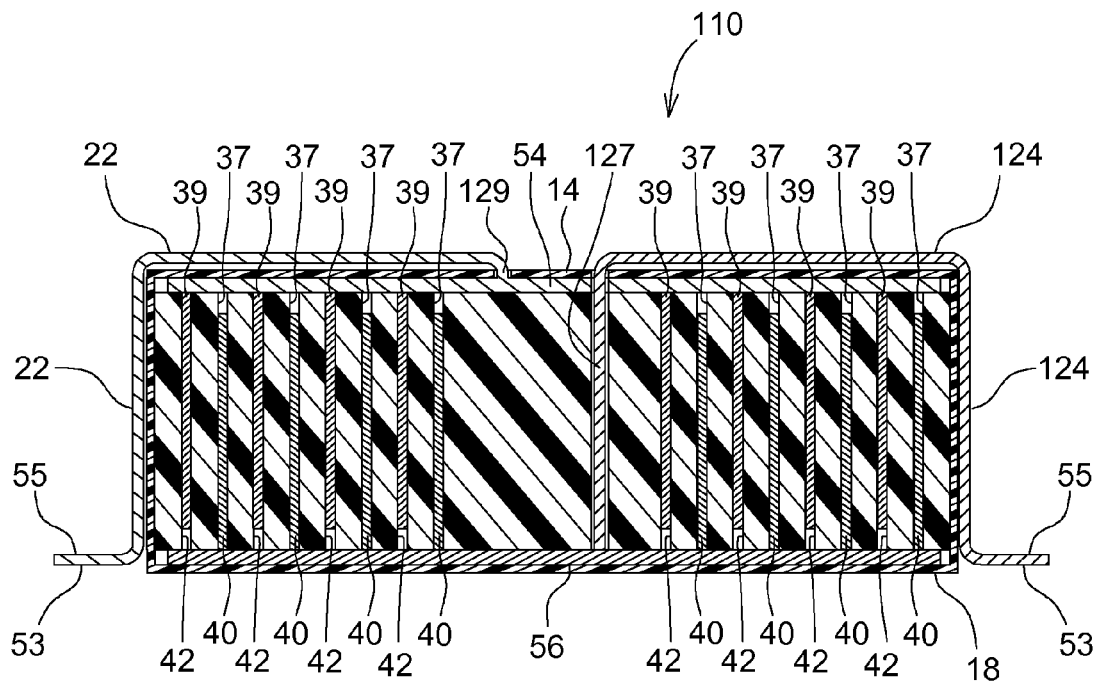
FIG. 6 shows a cross-section of the capacitor of FIG. 5 along reference line 6-6 of FIG. 5.
Figure 7:
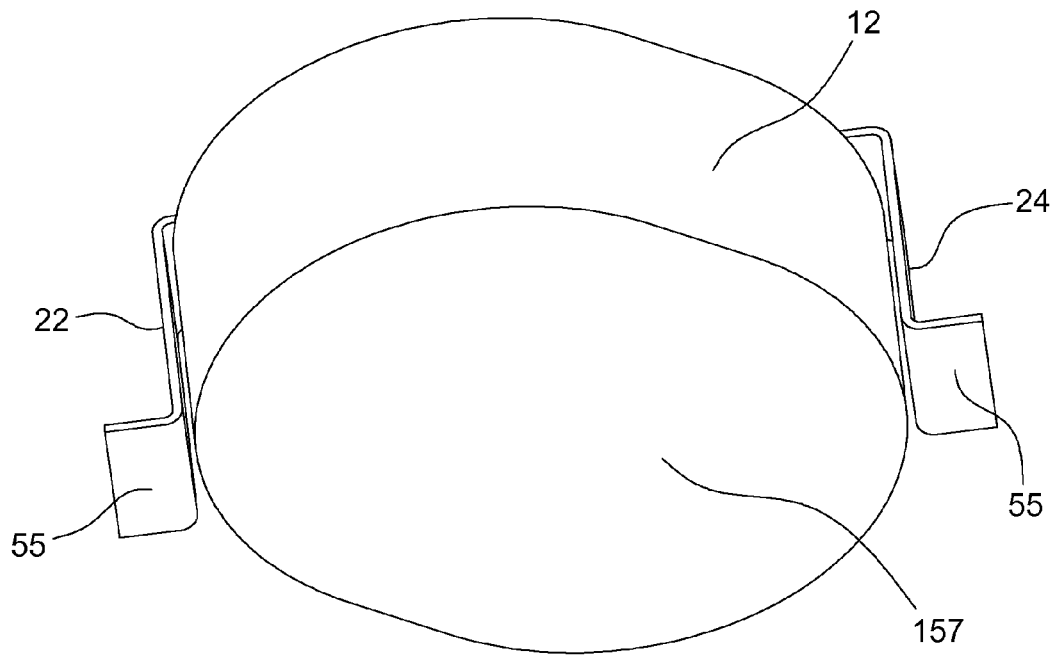
FIG. 7 shows a perspective view of a bottom of a capacitor of FIG. 5.

FIG. 5 through FIG. 7, illustrate an alternative embodiment of a 110 capacitor. The 110 capacitor of FIG. 5 through FIG. 7 is similar to the capacitor 10 of FIG. 2 through FIG. 4, except the second lead 124 of FIG. 6 differs from the second lead 24 of FIG. 3. Like reference numbers in FIG. 1 through FIG. 7, inclusive, indicate like elements.

As illustrated in FIG. 5 and FIG. 6, the first lead 22 is connected to the upper portion of the first conductive layer 39 via the first metallic member 54 at connection point 129, for example. The second lead 124 is coupled to a lower portion of the second conductive layer 40 via the second metallic member 56 and internal conductor 127. The second metallic member 56 may or may not be exposed in the capacitor of FIG. 5 through FIG. 7. For example, in FIG. 7 the second metallic member 56 is covered with bottom dielectric member 157, which may be integral or continuous with the dielectric package 12.

Figure 8:
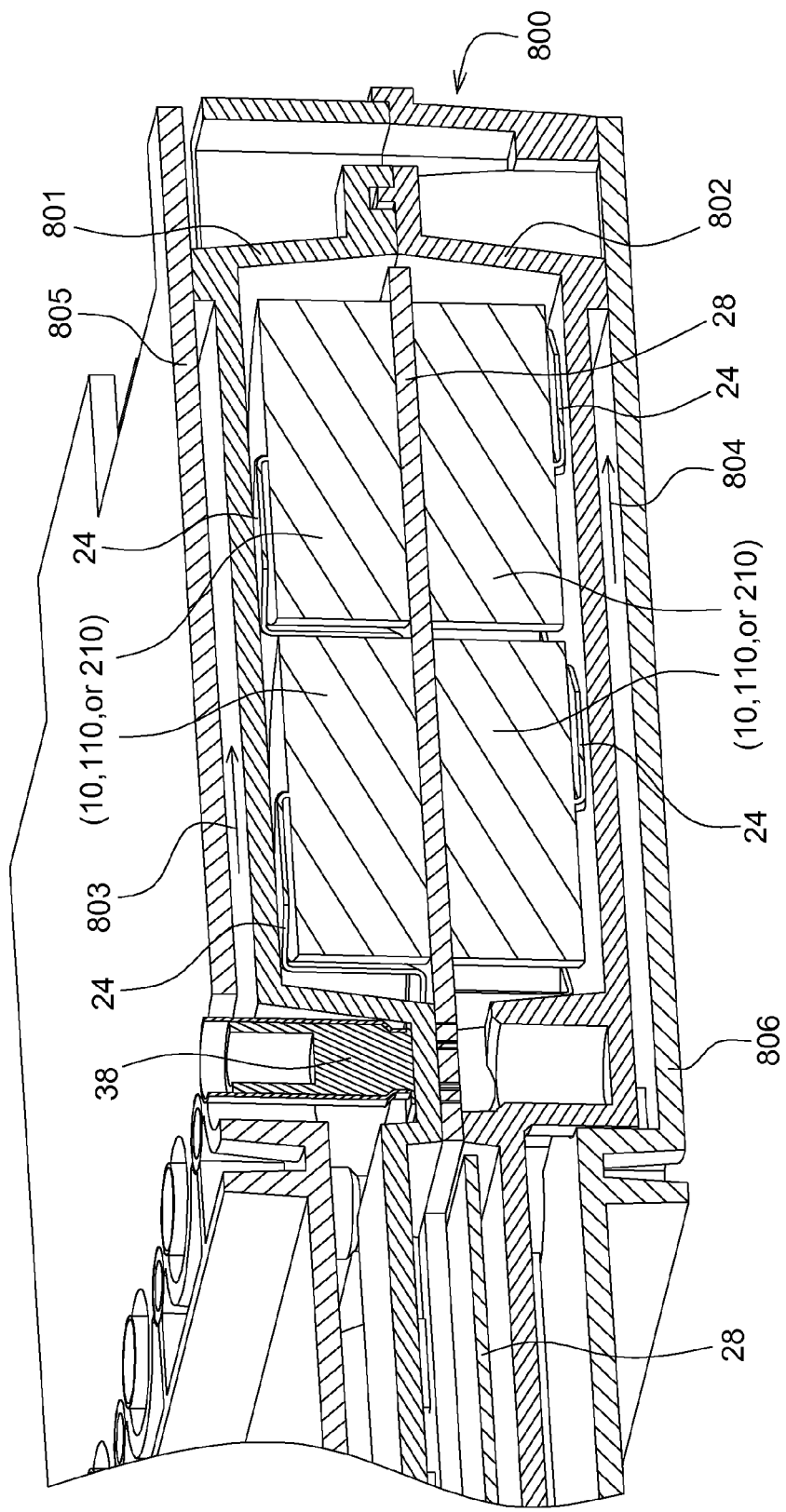
FIG. 8 shows a cross-section of an electronic assembly that is housed in an enclosure.

FIG. 8 illustrates the electronic assembly 11 of FIG. 1 that is housed in an enclosure 800. In FIG. 1, the enclosure 800 is omitted to better show the electronic assembly 11. Like reference numbers in FIG. 1 and FIG. 8 indicate like elements.

FIG. 8 illustrates an enclosure 800 for housing the electronic assembly 11, although any other housing or case may be made to house or surround the capacitors (e.g., 10, 110, or 210) to effectively conduct or transfer heat from the top 16 of the leads (e.g., 22, 24, 124). In this configuration, the enclosure has a first enclosure portion and a second enclosure portion that are mirror images of each other. The circuit board 28 has capacitors (e.g., 10, 110, or 210) on the first side 30, the second side 32, or both.

As illustrated in FIG. 8, the enclosure 800 comprises a first inner enclosure portion 801, a first outer enclosure portion 805, a second inner enclosure portion 802 and a second outer enclosure portion 806. The first inner enclosure portion 801 and the second inner enclosure portion 802 can be joined together with fasteners, adhesive, or another securing mechanism to hold or house the electronic assembly 11. The first outer enclosure portion 805 is capable of mating or sealing with the first inner portion 801 such that coolant or fluid may be retained or circulated within a chamber, conduit or passageway formed by the joining of the first outer enclosure portion 805 and the first inner enclosure portion 801. The second outer enclosure portion 806 is capable of mating or sealing with the second inner portion 802 such that coolant or fluid may be retained or circulated within a chamber, conduit or passageway formed by the joining of the second outer enclosure portion 806 and the second inner enclosure portion 802. In FIG. 8, illustrative arrows (803, 804) show where the fluid or coolant (e.g., water or ethylene glycol, or a solution thereof) would flow to cool the capacitors (e.g., 10, 110 or 210).

The first inner enclosure portion 801 engages or contacts first leads 22 and second leads (e.g., 24 or 124, if present) of a first set (e.g., rows 26) of capacitors (e.g., 10, 110 or 210) such that heat can axially flow away (e.g., upward) from the electronic assembly 11 via the enclosure 800. The second inner enclosure portion 802 engages or contacts first leads 22 and second leads 24 of the second set (e.g., rows 34) of capacitors (e.g., 10, 110, 210) such that heat can axially flow away (e.g., downward) from the electronic assembly 11 via the enclosure 800. The fluid or coolant may transfer or remove heat from the electronic assembly 11 or the capacitors (e.g., 10, 110, 210) by circulating or pumping the fluid through a radiator to the ambient air, for example. Further, mounting or soldering the capacitors (e.g., 10, 110 or 210) to the circuit board 28 via pads 55, an exposed portion of the second metallic member 56, or both allows for heat to be transferred or conducted away from the bottom 20 of the capacitor, through the circuit board 28, as well as through the top 16 of the capacitor 10 via a heat sink (e.g., fluid-cooled heat sink or chamber) above the capacitors.

In an alternate embodiment, a thermal interface material (TIM, not shown in FIG. 8) may be inserted or placed between the capacitor leads (e.g., 22, 24, 124) or top 16 of the capacitor (e.g., 10, 110 or 210) and the first inner enclosure portion 801 or the enclosure 800. Similarly, TIM may be inserted or placed between the capacitor leads (e.g., 22, 24, 124) or bottom 18 of the capacitor through the circuit board 28 via the heat sink (e.g., fluid-cooled heat sink or chamber) below the capacitors. A thermal interface material (TIM) may comprise a polymer, elastomer, adhesive, or plastic, such as silicone. The thermal interface material may be injected, injected molded or forced into any air gap between the capacitor. The TIM can provide dielectric insulation between the terminals (22, 24) and the enclosure 800 of the assembly. The TIM may also fill gaps between adjacent ones of the capacitors (e.g., 10, 110, or 210) to provide cooling to the printed circuit board 28 via conduction of heat outward toward the enclosure 800.

Figure 9:
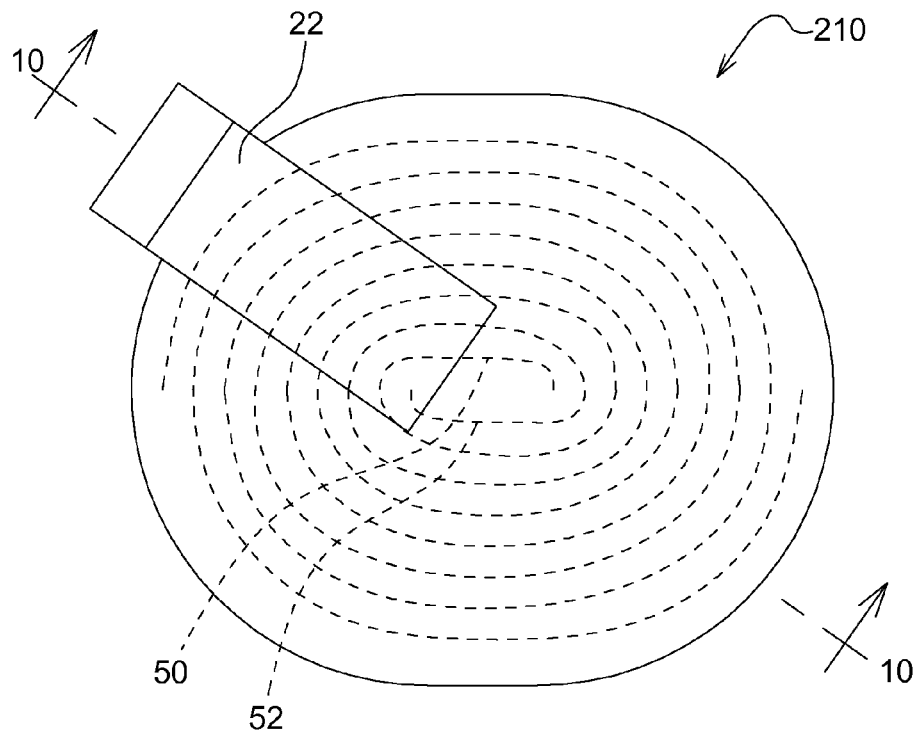
FIG. 9 illustrates a plan or top view of another embodiment of a capacitor that illustrates the interior windings in phantom.
Figure 10:
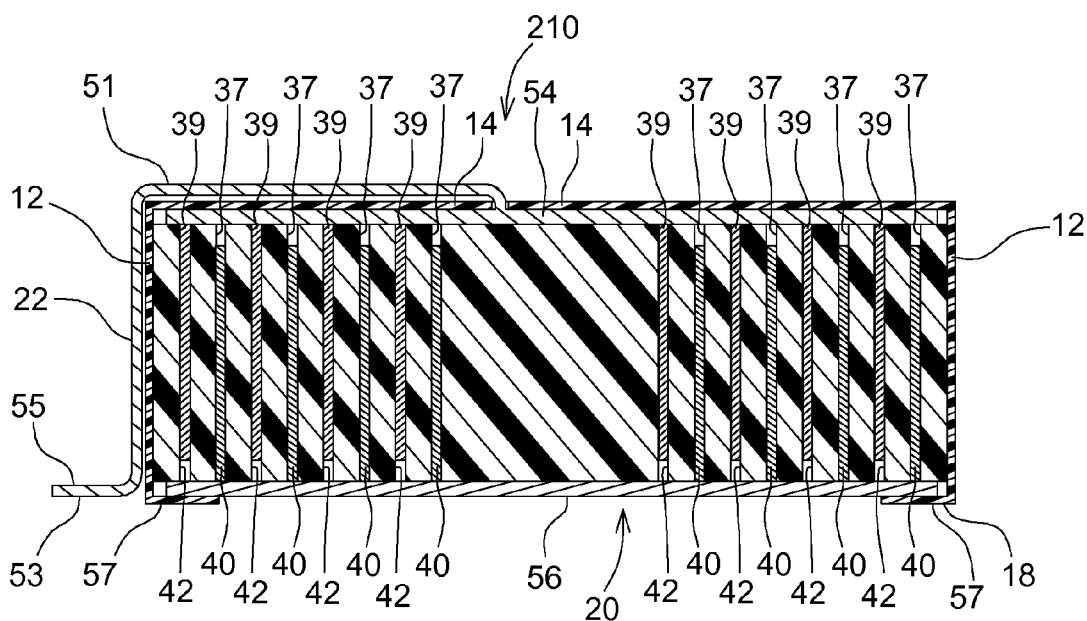
FIG. 10 shows a cross-section of the capacitor of FIG. 9 along reference line 10-10 of FIG. 9.
Figure 11:
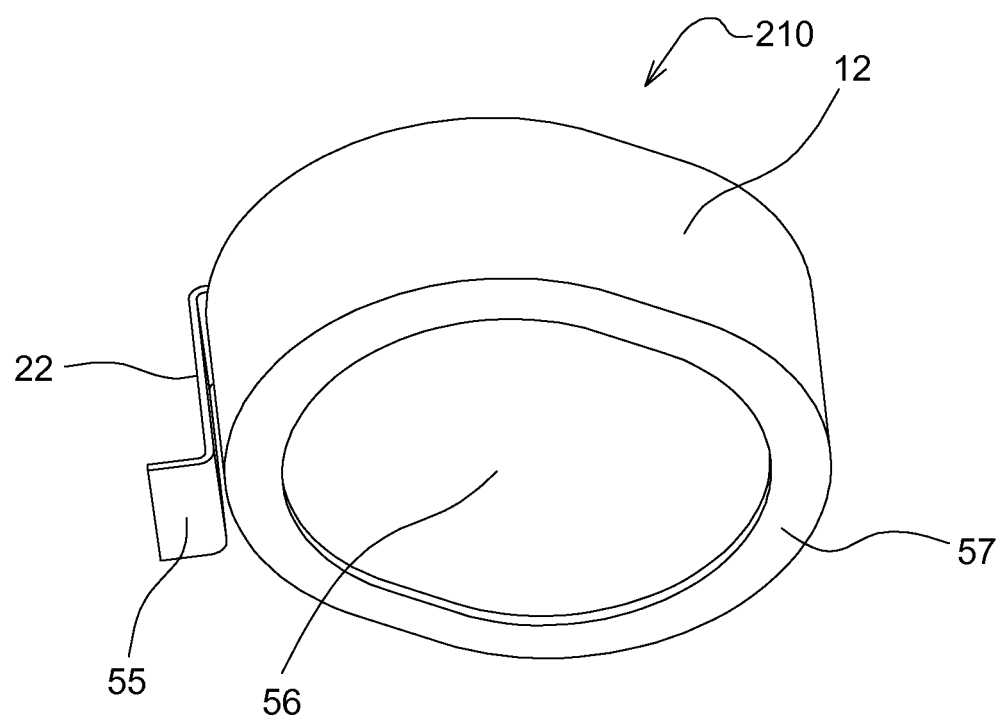
FIG. 11 shows a perspective view of a bottom of a capacitor of FIG. 9. Like reference numbers in different drawings indicate like elements.

FIG. 9 through FIG. 11, inclusive, provides an illustration of another alternate embodiment of a capacitor 210. The capacitor 210 of FIG. 9 through FIG. 11, inclusive, is similar to the capacitor 10 of FIG. 1 through FIG. 3, inclusive, except the second lead 24 is eliminated and the exposed metallic pad of the second metallic member 56 is used as an auxiliary terminal or terminal for the capacitor 210. The second lead 24 is not required because the second metallic member 56 can be exposed to serve as an auxiliary lead or electrode. The bottom 20 of the capacitor 210 has an optional exposed metallic surface or metal pad that provides additional heat sinking for greater power dissipation (e.g., in potentially smaller packages of the capacitor 210 than otherwise possible).

In any embodiments set forth in this document, the capacitor and electronic assembly are well-suited for securing certain capacitors (e.g., medium to small size capacitors) directly to a circuit board, while supporting thermal heat dissipation from the capacitor. Heat can dissipate or flow from the bottom of the capacitor, directly or indirectly, through the circuit board and then to the enclosure. For example, an exposed pad of the second metallic member (e.g., 56) may provide a surface for efficient heat transfer to a metallic trace or metallic pour (e.g. heavy copper pour) on the circuit board. Heat can also dissipate or flow from the top of the capacitor, directly to the enclosure or to ambient air. The enclosure may comprise a heat sink with a jacket or coolant chamber for cooling the enclosure, one or more capacitors and an electronic assembly.

The leads of the capacitor are also arranged for efficient thermal dissipation to ambient air, the enclosure and the circuit board via corresponding pads or conductive traces. Because one or more capacitors of the electronic assembly can be kept cooler, the electronic assembly (e.g., such as an inverter or controller) can operate reliably over a longer lifespan or have greater current or power handling capacity than otherwise possible.

Having described the preferred embodiment, it will become apparent that various modifications can be made without departing from the scope of the invention as defined in the accompanying claims.

The invention claimed is:

1. A capacitor comprising:
   a first winding member comprising a first dielectric layer and a first conductive layer, the first conductive layer overlying at least a portion of the first dielectric layer;
   a second winding member comprising a second dielectric layer and second conductive layer, the second conductive layer overlying at least a portion of the second dielectric layer, the first winding member interleaved, partially or entirely, with the second winding layer;
   a dielectric package for at least radially containing or bordering the first winding member and the second winding member;
   a first metallic member having a generally planar, radially extending surface for electrically and mechanically contacting an upper portion of the first conductive layer;
   a second metallic member having a generally planar, radially extending surface for electrically and mechanically contacting a lower portion of the second conductive layer, wherein the dielectric package has a lower side surface opposite an upper side surface; the lower side surface adjoining or comprising the second metallic member having an exposed exterior surface or a metallic pad;
   a first lead coupled to the first metallic layer and extending through an upper side surface, wherein the first lead extends from the upper side to the lower side to terminate in another metallic pad or generally planar lower surfaces substantially parallel or co-planar to the lower side surface; and
   a second lead extending through the upper side surface, the second lead spaced apart from the first lead, wherein the second lead is coupled to an upper portion of the first conductive layer via the first metallic member.

2. The capacitor according to claim 1 wherein the first lead has generally planar surfaces parallel to or co-planar to the upper side surface and the lower side surface; and further comprising:
the second lead having generally planar surfaces parallel to or co-planar to the upper side surface and the lower side surface.

3. The capacitor according to claim 1 wherein the second metallic member is substantially planar and wherein there is a dielectric border that is electrically isolated from the second metallic member.

4. The capacitor according to claim 1 wherein the first lead terminates in said another metallic pad for mounting on a circuit board and wherein the second lead terminates in a conductive pad for mounting on the circuit board.

5. The capacitor according to claim 1 wherein the second metallic member extends radially outward from a central axis of the package.

6. The capacitor according to claim 1 wherein the first lead and the second lead extend radially outward diagonally from or near the central axis of the package.

7. The capacitor according to claim 1 wherein each one of the first winding member and the second winding member has a substantially spiral cross-section of its respective conductive layer.

8. The capacitor according to claim 1 wherein the first lead terminates radially outward from the exposed exterior surface.

9. An electronic assembly comprising:
a circuit board having one or more conductive traces;
a capacitor for mounting on the circuit board, the capacitor comprising:
a first winding member comprising a first dielectric layer and a first conductive layer, the first conductive layer overlying the first dielectric layer;
a second winding member comprising a second conductive layer and a second dielectric layer, the second conductive layer overlying the second dielectric layer, the first winding member interleaved, partially or entirely, with the second winding layer;
a dielectric package for containing radially or bordering radially the first winding member and the second winding member, the dielectric package having an upper side surface;
a first metallic member having a generally planar, radially extending surface for electrically and mechanically contacting an upper portion of the first conductive layer;
a second metallic member having a generally planar, radially extending surface for electrically and mechanically contacting a lower portion of the second conductive layer, wherein the dielectric package has a lower side surface opposite the upper side surface; the lower side surface adjoining or comprising the second metallic member having an exposed exterior surface or a metallic pad;
a first lead coupled to the first metallic layer and extending through the upper side surface, wherein the first lead extends from the upper side to the lower side to terminate in another metallic pad or generally planar lower surfaces substantially parallel or co-planar to the lower side surface; and
a second lead extending through the upper side surface, the second lead spaced apart from the first lead, wherein the second lead is coupled to an upper portion of the first conductive layer via the first metallic member.

10. The electronic assembly according to claim 9 wherein the first lead has generally planar surfaces parallel to or co-planar to the upper side surface and the lower side surface; the second lead has generally planar surfaces parallel to or co-planar to the upper side surface and the lower side surface.

11. The electronic assembly according to claim 9 wherein the metallic pad of the exposed exterior surface is soldered to a corresponding mounting pad or conductive trace on the circuit board.

12. The electronic assembly according to claim 9 further comprising a plurality of said capacitors that are arranged in one more rows on the circuit board.

13. The electronic assembly according to claim 9 further comprising a first set of said capacitors mounted on a first side of the circuit board and a second set of said capacitors mounted on a second side of the circuit board opposite the first side.

14. The electronic assembly according to claim 13 further comprising:
an enclosure having an first enclosure portion for engaging or contacting first leads and second leads of the first set of capacitors and a second enclosure portion for engaging or contacting first leads and second leads of the second set of capacitors such that heat can axially flow away from the electronic assembly via the enclosure.

15. An electronic assembly comprising:
a circuit board having one or more conductive traces;
a capacitor for mounting on the circuit board, the capacitor comprising:
a first winding member comprising a first dielectric layer and a first conductive layer, the first conductive layer overlying the first dielectric layer;
a second winding member comprising a second conductive layer and a second dielectric layer, the second conductive layer overlying the second dielectric layer, the first winding member interleaved, partially or entirely, with the second winding layer;
a dielectric package for containing radially or bordering radially the first winding member and the second winding member, the dielectric package having an upper side surface;
a first metallic member having a generally planar, radially extending surface for electrically and mechanically contacting an upper portion of the first conductive layer;
a second metallic member having a generally planar, radially extending surface for electrically and mechanically contacting a lower portion of the second conductive layer, wherein the dielectric package has a lower side surface opposite the upper side surface; the lower side surface adjoining or comprising the second metallic member having an exposed exterior surface or a metallic pad;
a first lead coupled to the first metallic layer and extending through the upper side surface, wherein the first lead extends from the upper side to the lower side to terminate in another metallic pad or generally planar lower surfaces substantially parallel or co-planar to the lower side surface, wherein the first lead terminates radially outward from the exposed exterior surface; and
a second lead extending through the upper side surface, the second lead spaced apart from the first lead.

* * * * *